(12) United States Patent
Yang et al.

(10) Patent No.: US 7,594,628 B2
(45) Date of Patent: Sep. 29, 2009

(54) MOUNTING APPARATUS FOR CABLE MANAGEMENT ARM

(75) Inventors: Chieh Yang, Taipei Hsien (TW); Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 256 days.

(21) Appl. No.: 11/558,474

(22) Filed: Nov. 10, 2006

(65) Prior Publication Data

US 2008/0111032 A1 May 15, 2008

(51) Int. Cl.
*E21F 17/02* (2006.01)

(52) U.S. Cl. .................... 248/58; 361/825; 361/826

(58) Field of Classification Search ............. 361/825, 361/826; 248/58, 57, 56, 68.1, 65, 219.4
See application file for complete search history.

(56) References Cited

U.S. PATENT DOCUMENTS

| | | | |
|---|---|---|---|
| 2,746,110 A * | 5/1956 | Bedford, Jr. ............... 211/26.2 |
| 5,575,665 A * | 11/1996 | Shramawick et al. ......... 439/49 |
| 5,954,301 A | 9/1999 | Joseph et al. |
| 6,394,398 B1 * | 5/2002 | Reed et al. .................... 248/57 |
| 6,708,931 B2 * | 3/2004 | Miura ....................... 248/68.1 |
| 7,189,924 B1 * | 3/2007 | Popescu et al. ............... 174/69 |
| 2003/0026084 A1 * | 2/2003 | Lauchner .................... 361/826 |
| 2004/0226900 A1 * | 11/2004 | Canty et al. ................... 211/26 |
| 2005/0067358 A1 * | 3/2005 | Lee et al. ...................... 211/26 |

\* cited by examiner

*Primary Examiner*—Amy J. Sterling
(74) *Attorney, Agent, or Firm*—Wei Te Chung

(57) ABSTRACT

A mounting apparatus for mounting a cable management arm to a rack includes a securing piece formed on one side of the cable management arm, and a supporting piece formed on the rack corresponding to the securing piece. The securing piece defines a receiving space therein. A locking tab is arranged on one of the securing piece and the supporting piece. A locking hole is defined in the other of the securing piece and the supporting piece. The supporting piece is received in the receiving space in such a manner that the supporting piece moves in the receiving space from a first position, in which the supporting piece resists against the securing piece to bend the securing piece, to a second position, in which the securing piece rebounds to have the locking tab inserted into the locking hole.

16 Claims, 6 Drawing Sheets

MOUNTING APPARATUS FOR CABLE MANAGEMENT ARM

BACKGROUND

1. Field of the Invention

The present invention relates to mounting apparatuses for cable management arms, and more particularly to a mounting apparatus for conveniently mounting a cable management arm onto a rack.

2. Description of Related Art

Certain computer systems, such as computer network systems, are typically constructed from many separate computer units or servers that are positioned and stacked relative to each other in a rack. The various computer servers in the system are electrically interconnected to each other and provide various functions, such as storage, communications, calculations, etc. The rack includes a plurality of support columns, where each computer server is secured to opposing slide assemblies attached to the columns. The slide assemblies allow the server to be pulled away from the front of the rack so that each separate server can be serviced by technicians for various reasons, such as maintenance, replacement of computer cards, etc., while the server is still in operation.

A typical computer server includes a plurality of input and output cables coupled to a back panel of the server, including power cables, data cables, communication lines, keyboard lines, and so on. It is therefore desirable to include some type of cable management device, such as a cable management arm, that allows the various cables to be collected at the back of the computer server and rack for convenience and organization. The cable management arm is typically directly mounted to the rack by a plurality of screws. However, it is laborious to drive a plurality of screws in or out to attach or detach the cable management arm to the rack.

It is therefore desirable to find a new mounting apparatus for conveniently mounting the cable management arm to the rack.

SUMMARY OF THE INVENTION

A mounting apparatus for mounting a cable management arm to a rack includes a securing piece formed on one side of the cable management arm, and a supporting piece formed on the rack corresponding to the securing piece. The securing piece defines a receiving space therein. A locking tab is arranged on one of the securing piece and the supporting piece. A locking hole is defined in the other of the securing piece and the supporting piece. The supporting piece is received in the receiving space in such a manner that the supporting piece moves in the receiving space from a first position, in which the supporting piece resists against the securing piece to bend the securing piece, to a second position, in which the securing piece rebounds to have the locking tab inserted into the locking hole.

Other advantages and novel features will be drawn from the following detailed description of preferred embodiments with attached drawings, in which:

DETAILED DESCRIPTION OF THE INVENTION

Figure 1:
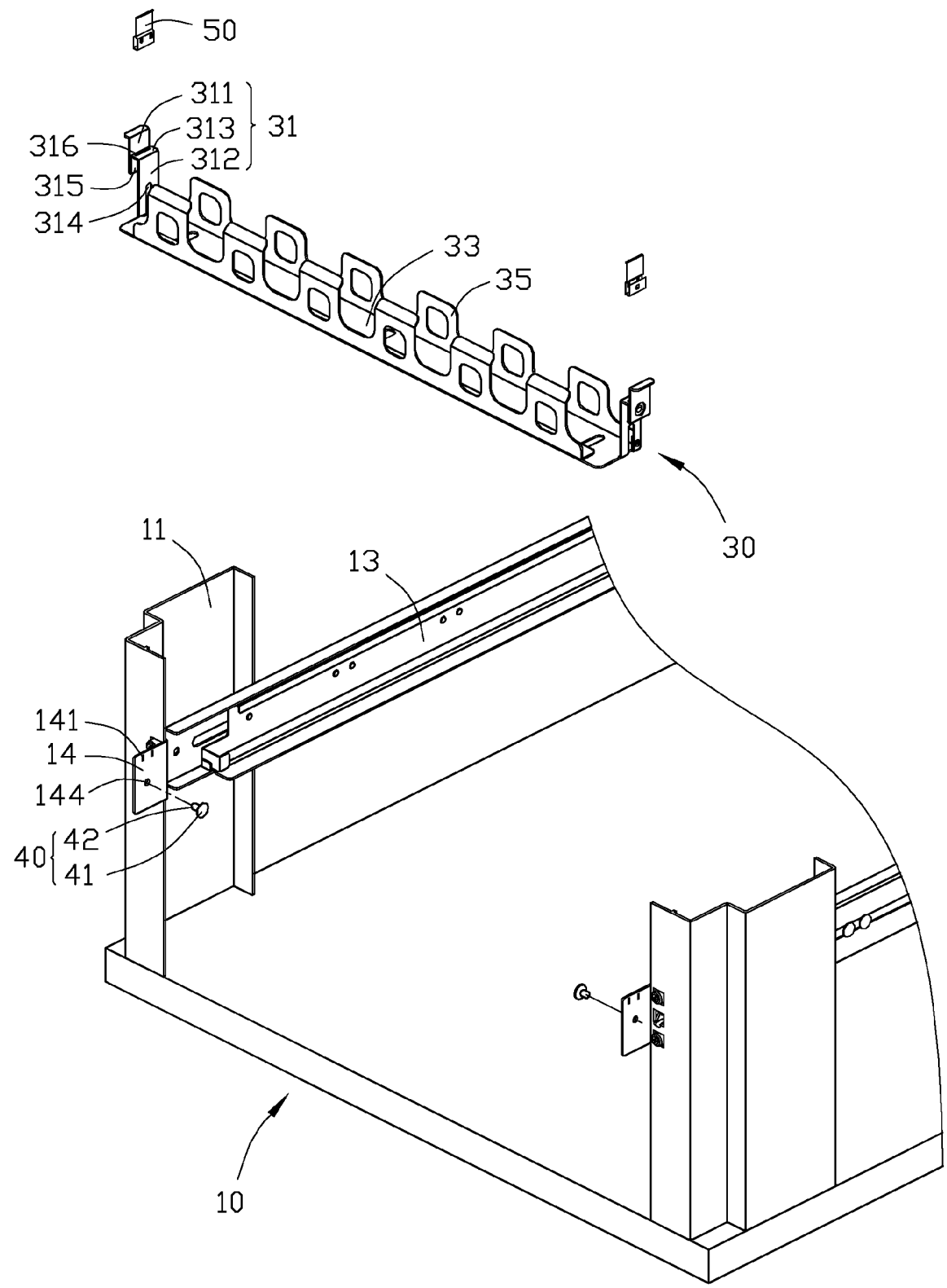
FIG. 1 is an exploded isometric view of a mounting apparatus in accordance with a preferred embodiment of the present invention for mounting a cable management arm to a rack, part of which is cut away.

Referring to FIG. 1, a mounting apparatus in accordance with a preferred embodiment of the present invention is used to mount a cable management arm 30 to a rack 10.

The rack 10 includes a plurality of support columns 11 with a pair of sliders 13 oppositely attached thereon. The sliders 13 are used to slidably mount different computer modules with cables (not shown) on the rack 10. A pair of supporting pieces 14 is respectively secured on a pair of the support columns 11 corresponding to rear sides of the pair of sliders 13. Each of the supporting pieces 14 defines a pair of locking holes 141 therein.

The cable management arm 30 includes a rectangular base 33, a pair of side panels 35 extending perpendicularly and upwardly from opposite long sides of the base 33, and a pair of securing pieces 31 extending perpendicularly and upwardly from opposite short sides of the base 33. The side panels 35 define a plurality of pair of coaxial holes configured for collecting the cables of the computer modules. Each of the securing pieces 31 includes a first piece 311 perpendicular to the base 33, a second piece 312 parallel to the first piece 311, and a stopping piece 313 connecting the first piece 311 with the second piece 312. The second piece 312 is connected with the corresponding short side of the base 33. A receiving space 315 is defined among the parallel first and second pieces 311, 312 and the stopping piece 313. A guiding groove 314 is defined in the second piece 312 and communicates with a bottom of the second piece 312. A cutout 334 (see FIG. 5) is defined on the base 33 near each of the securing pieces 31. The cutout 334 communicates with the groove 314 and passes through the base 33. The guiding groove 314 is narrower than the cutout 334. The stopping piece 313 defines a slot 316 therein. The first piece 311 forms a protrusion 317 extending toward the second piece 312 (see FIG. 3).

A pair of guiding pins 40 is configured to be secured on the pair of supporting pieces 14. Each of the guiding pins 40 includes a head portion 41 and a shank portion 42. In the present embodiment, the guiding pin 40 is a screw. A diameter of the head portion 41 is larger than a width of the guiding groove 314, and smaller than a width of the cutout 334. A diameter of the shank portion 42 is smaller than the width of the guiding groove 314.

Figure 2:
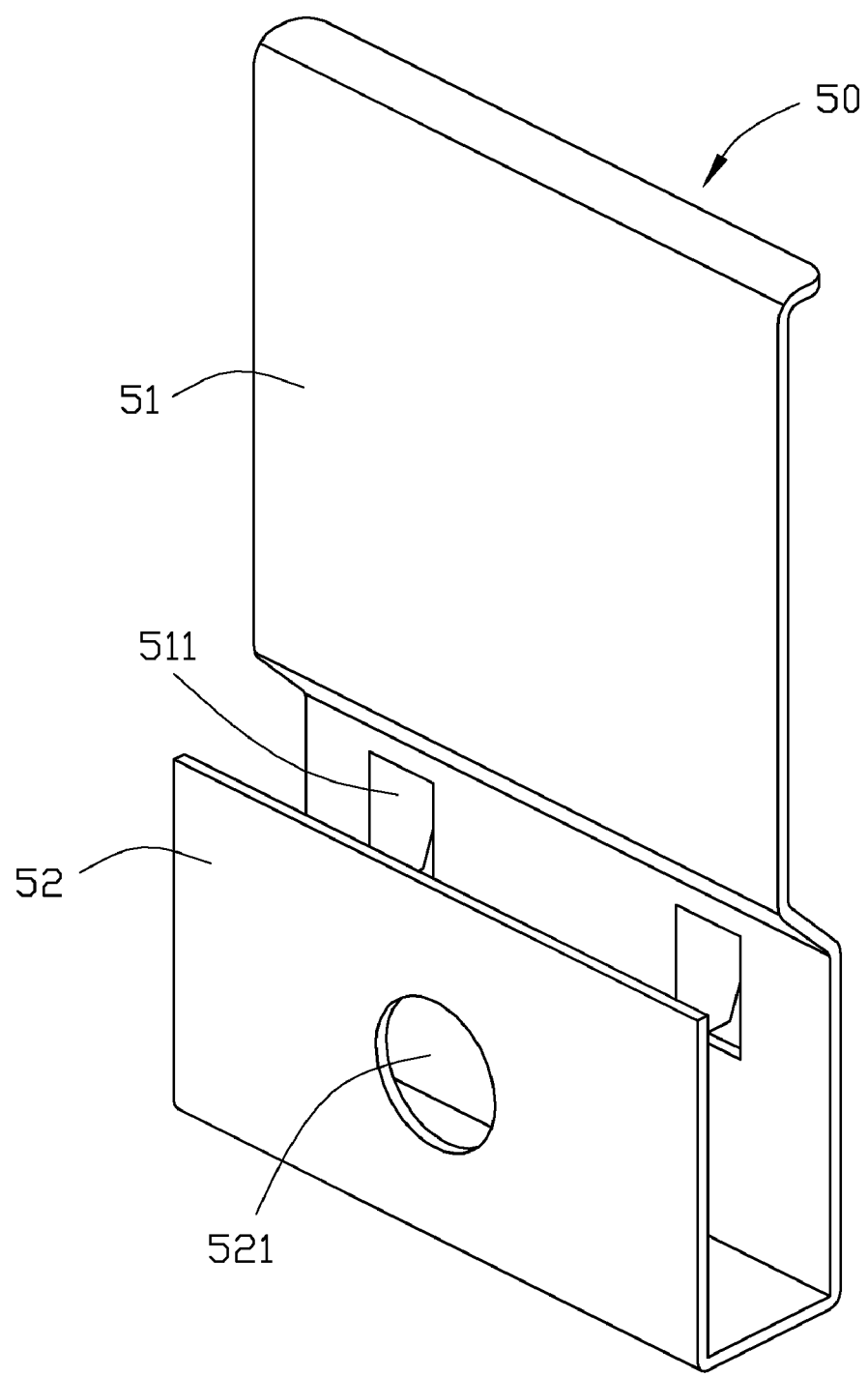
FIG. 2 is an isometric view of an actuating member of the mounting apparatus of FIG. 1.

Referring to FIG. 2, an actuating member 50 includes an elastic operating portion 51, and a securing portion 52 extending from a bottom of the operating portion 51 rearward and then upward. A hole 521 is defined in the securing portion 52 corresponding to the protrusion 317 of the securing piece 31. A lower portion of the operating portion 51 is stamped away from the securing portion 52 to form a pair of locking tabs 511 corresponding to the pair of locking holes 141 of the support piece 14. Each locking tab 511 includes a chamfer 513 (see FIG. 3).

Figure 3:
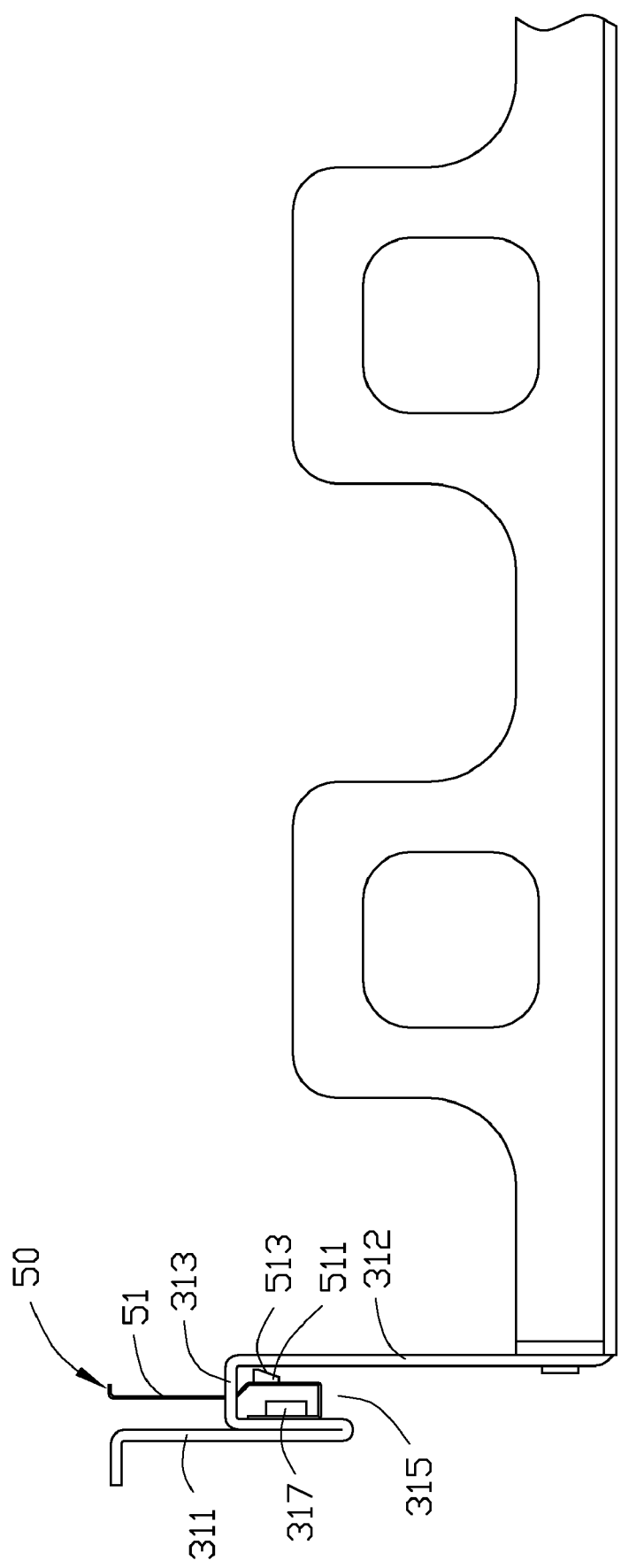
FIG. 3 is a partial elevational view of the cable management arm of FIG. 1 with the actuating member of FIG. 2 attached thereon.

Referring to FIG. 3, the actuating member 50 is moved into the receiving space 315 with the protrusion 317 of the securing piece 31 inserted into the hole 521 of the actuating member 50 to secure the actuating member 50 on one of the securing pieces 31 of the cable management arm 30. Simultaneously, an upper portion of the elastic operating portion 51 of the actuating member 50 extends through the slot 316 of the stopping piece 313 to be exposed out of the receiving space 315. The pair of locking tabs 511 on the lower portion of the elastic operating portion 51 of the operating portion 50 is left in the receiving space 315, and faces the second piece 312. Another actuating member 50 is secured on the other securing piece 31 of the cable management arm 30 in the above-described manner.

Figure 4:
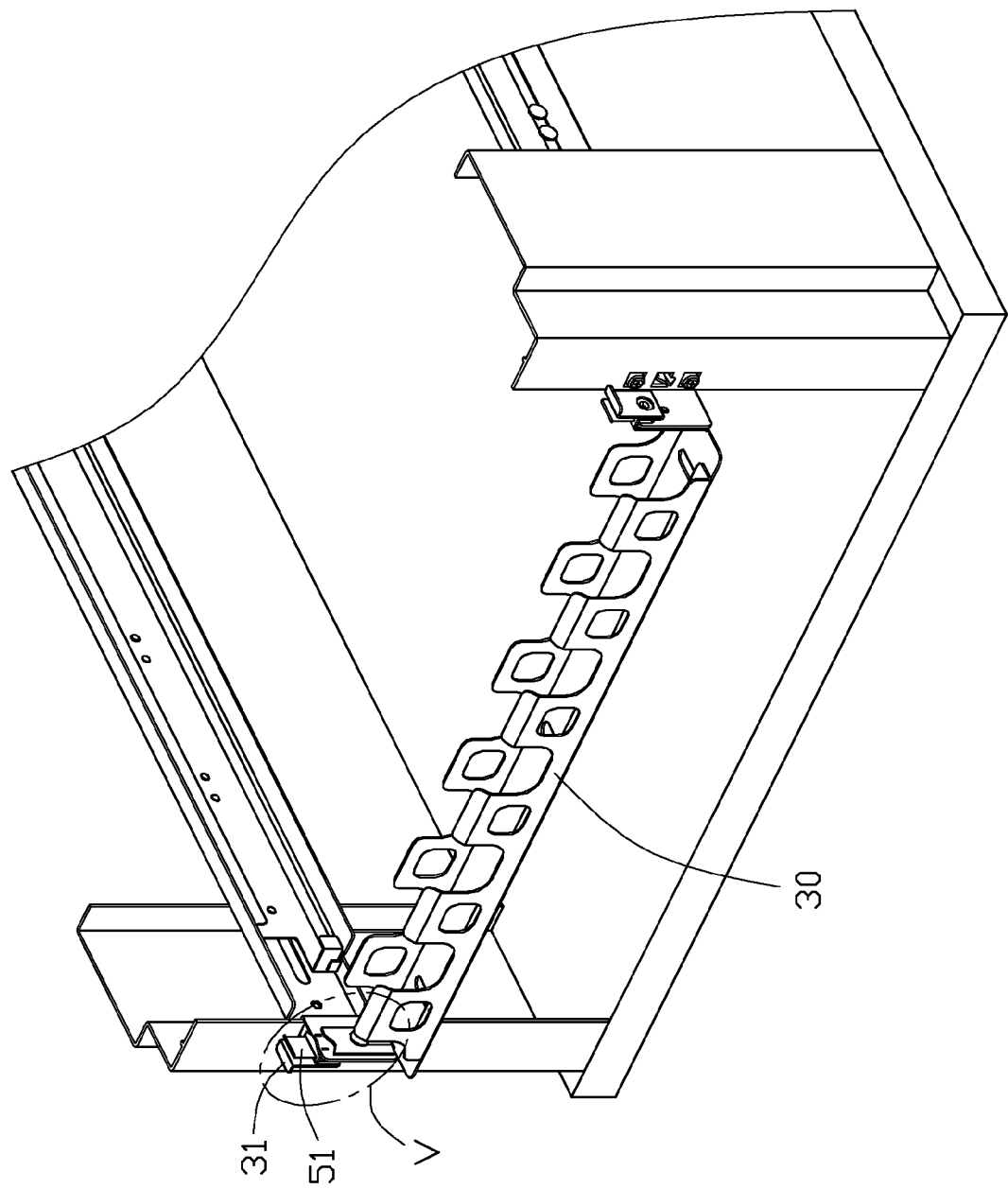
FIG. 4 is an assembled view of the cable management arm and the rack of FIG. 1, part of the cable management arm being cut away.
Figure 5:
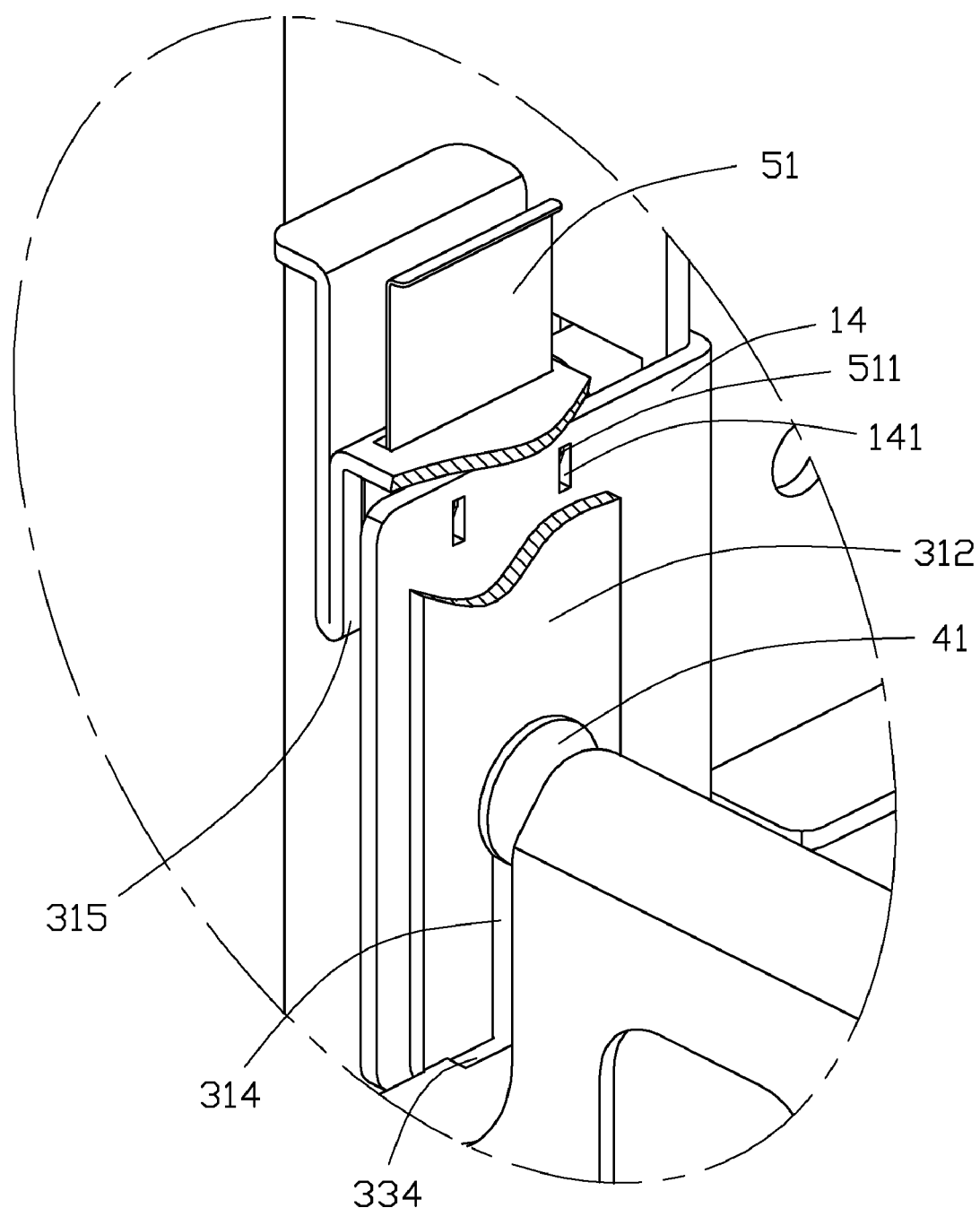
FIG. 5 is an enlarged view of an encircled portion V of FIG. 4.

Referring to FIGS. 4 and 5, part of the shank portion 42 of one of the guiding pins 40 is inserted and secured in the securing hole 144 of one of the support pieces 14, and another part of the shank portion 42 of the guiding pin 40 is exposed out of the hole 144. The other guiding pin 40 is secured on the other support piece 14 in the same manner. The guiding pins 40 also can be formed on the support pieces 14 directly.

In assembly of the cable management arm 30 to the rack 10, the cable management arm 30 is moved downward. On the left side of the cable management arm 30 and the rack 10, the head portion 41 of the guiding pin 40 extends through the cutout 334 of the base 33, and the shank portion 42 of the guiding pin 40 slides in the guiding groove 314 of the corresponding second piece 312 of the securing piece 31. The supporting piece 14 inserts into the receiving space 315 of the securing piece 31. A top of the supporting piece 14 resists against the chamfers 513 of the locking tabs 511 to elastically bend the operating portion 51 of the actuating member 50. The cable management arm 30 moves downward until the top of the supporting piece 14 resists against a bottom of the stopping piece 313 to support the cable management arm 30 thereon. The locking tabs 511 of the actuating member 50 are aligned with the locking holes 141 of the supporting piece 14, and the operating portion 51 of the actuating member 50 rebounds to have the locking tabs 511 inserted into the locking holes 141 to secure the cable management arm 30 on the rack 10. Simultaneously, the shank portion 42 of the guiding pin 40 resists against the second piece 312 at a top edge of guiding groove 314. On the right side, the securing piece 31 is secured on the supporting piece 14 in the same process.

In disassembly of the cable management arm 30 from the rack 10, the upper portions of the operating portions 51 of the pair of actuating members 50 are pushed outward to disengage the locking tabs 511 from the locking holes 141. Then, the cable management arm 30 is lifted up to have the guiding pins 40 slide out of the guiding slots 314, so the cable management arm 30 is detached from the rack 10.

Figure 6:
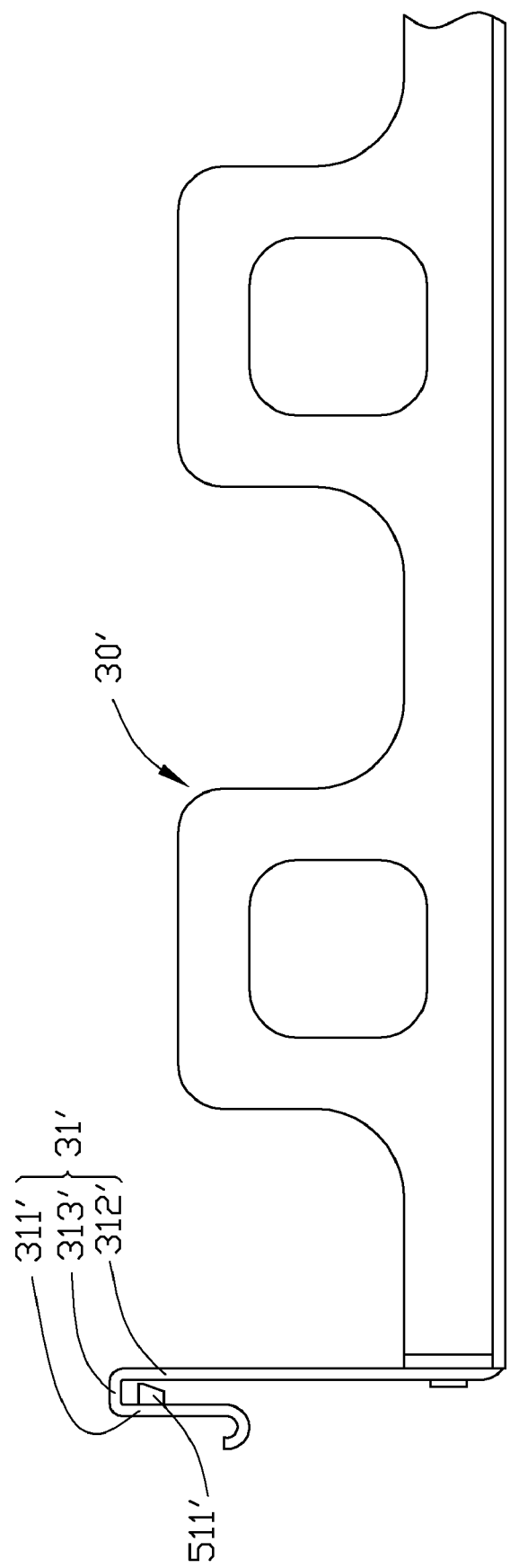
FIG. 6 is a partial elevational view of another embodiment of the cable management arm.

Referring to FIG. 6, another embodiment of the cable management arm is shown. A cable management arm 30' in FIG. 6 is different from the cable management arm 30 of the above embodiment as shown in FIG. 3. The actuating member 50 of the above embodiment is incorporated to the cable management arm 30'. The cable management arm 30' includes a securing piece 31' on each short side of the cable management arm 30'. The securing piece 31' includes an elastic first piece 311' perpendicular to the base 33', and a second piece 312' parallel to the first piece 311', and a stopping piece 313' connecting the first piece 311' with the second piece 312'. The second piece 312' is connected with the cable management arm 30'. The first piece 311' forms a locking tab 511' extending towards the second piece 312'.

In assembly of the cable management arm 30' to the rack 10, the cable management arm 30' is moved downward. The supporting piece 14 resists against the locking tab 511' to elastically bend the first piece 311'. The cable management arm 30' moves downward until the top of the supporting piece 14 resists against a bottom of the stopping piece 313' to support the cable management arm 30' thereon. Simultaneously, the locking tab 511' are aligned with the locking hole 141 of the supporting piece 14, and the first piece 311' rebounds to have the locking tab 511' inserted into the locking hole 141 to secure the cable management arm 30' on the rack 10.

In disassembly of the cable management arm 30' from the rack 10', the first piece 31' is pushed outward to disengage the locking tab 511' from the locking hole 141. Then, the cable management arm 30' is lifted up to be detached from the rack 10.

In above two embodiments, the locking tabs can be formed on the supporting piece, and the locking holes can be defined in the securing piece.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A rack, comprising:
a plurality of support columns;
a pair of supporting pieces secured on the support columns, each of the supporting pieces providing a guiding pin;
a cable management arm comprising a pair of securing pieces on opposite sides thereof, each of the securing pieces defining a guiding groove therein, the cable management arm sandwiched by the pair of supporting pieces in such a manner that the guiding pins of the pair of supporting pieces are received in the guiding grooves of the pair of the securing pieces; and
a locking mechanism configured to lock each of the securing pieces onto the supporting pieces;
wherein the cable management arm defines at each side thereof a cutout that communicates with the guiding groove, the cutout is wider than the guiding groove, the guiding pin comprises a head portion and a shank portion, a diameter of the head portion is larger than a width of the guiding groove, and smaller than a width of the cutout, a diameter of the shank portion is smaller than the width of the guiding groove.

2. The rack as described in claim 1, wherein the locking mechanism comprises a locking tab attached on each of the securing pieces, and a locking hole configured for receiving the locking tab therein defined in each of the supporting pieces.

3. The rack as described in claim 2, wherein the securing piece comprises a stopping piece, and a top of the supporting piece supports a bottom of the stopping piece to support the cable management arm thereon.

4. The rack as described in claim 3, wherein the securing piece comprises a first piece and a second piece on two sides of the stopping piece, the first piece, the second piece, and the stopping piece are integrally formed and together define a receiving space configured to receive the supporting piece therein.

5. The rack as described in claim 4, wherein the first piece is an elastic piece, the locking tab is attached on the first piece extending towards the second piece and located below the stopping piece.

6. The rack as described in claim 4, wherein an actuating member is secured on the first piece, the actuating member comprises an elastic operating portion, the locking tab is formed on the operating portion extending toward the second piece and located below the stopping piece.

7. The rack as described in claim 6, wherein the stopping piece defines a slot, an upper portion of the operating portion passes through the slot to be exposed out of the receiving space.

8. A rack comprising:
a pair of support columns with a pair of parallel sliders extending away therefrom in a front-and-back direction, the sliders being configured to slidably mount computer modules with cables on the rack;
a pair of supporting pieces secured on the support columns respectively, each of the supporting pieces providing a guiding pin;
a cable management arm comprising a plurality of spaced holes configured for collecting the cables of the computer modules, the cable management arm comprising a pair of securing pieces on opposite ends thereof supported on the respective supporting pieces, each of the securing pieces defining a guiding groove, the guiding pins of the supporting pieces being capable of sliding in the guiding grooves of the respective securing pieces in a up-and-down direction but limited in the guiding grooves in the front-and-back direction and a left-and-right direction; and
a locking mechanism comprising a locking slot and a locking tab being formed between each of the securing pieces and the corresponding supporting piece for securing the securing piece and the supporting piece together.

9. The rack as described in claim 8, wherein the locking tab is formed at an elastic member which provides an elastic rebound force for driving the locking tab to engage in the locking slot.

10. The rack as described in claim 8, wherein the cable management arm defines at each end thereof a cutout communicating with the corresponding guiding groove, the cutout is wider than the guiding groove, the guiding pin comprises a head portion and a shank portion, a diameter of the head portion is larger than a width of the guiding groove and smaller than a width of the cutout, a diameter of the shank portion is smaller than the width of the guiding groove.

11. A rack comprising:
a cable management arm, a securing piece formed on one side of the cable management arm, the securing piece defining a receiving space therein; and
a supporting piece formed on the rack corresponding to the securing piece, wherein a locking tab is arranged on one of the securing piece and the supporting piece, a locking hole is defined in the other of the securing piece and the supporting piece, the supporting piece is received in the receiving space in such a manner that the supporting piece moves in the receiving space from a first position, in which the supporting piece resists against the securing piece to bend the locking tab, to a second position, in which the locking tab rebounds to have the locking tab inserted into the locking hole;
wherein the securing piece comprises a storming piece, and a top of the supporting piece supports a bottom of the stopping piece to support the cable management arm thereon, the securing piece further comprises a first piece and a second piece on two sides of the stopping piece, the first piece, the second piece, and the stopping piece together define the receiving space, the first piece is an elastic piece, the locking tab is attached on the first piece extending towards the second piece and located below the stopping piece.

12. The rack as described in claim 11, wherein the second piece defines a guiding groove, and the supporting piece provides a guiding pin configured to slide in the guiding groove.

13. The rack as described in claim 12, further comprising a cutout defined in the cable management arm and communicating with the guiding groove, wherein the cutout is wider than the guiding groove, the guiding pin comprises a head portion and a shank portion, a diameter of the head portion is larger than a width of the guiding groove, and smaller than a width of the cutout, a diameter of the shank portion is smaller than the width of the guiding groove.

14. The rack as described in claim 11, wherein an actuating member is secured on the first piece, the actuating member comprises an elastic operating portion, the locking tab is formed on the operating portion extending towards the second piece and located below the stopping piece.

15. The rack as described in claim 14, wherein the stopping piece defines a slot, an upper portion of the operating portion extends through the slot to be exposed out of the receiving space.

16. The rack as described in claim 11, wherein the locking tab comprises a chamfer configured to resist against the supporting piece in the first position.

* * * * *